US006037840A

United States Patent [19]

Myer

[11] Patent Number: 6,037,840

[45] Date of Patent: Mar. 14, 2000

[54] ARTICLE COMPRISING A COMBINER-SPLITTER

[75] Inventor: Robert E. Myer, Denville, N.J.

[73] Assignee: Lucent Technologies, Inc., Murray Hill, N.J.

[21] Appl. No.: 08/994,031

[22] Filed: Dec. 18, 1997

[51] Int. Cl.[7] ....... H03F 3/68

[52] U.S. Cl. ....... 330/295; 330/124 R; 330/286

[58] Field of Search ....... 330/295, 286, 330/124 R

[56] References Cited

U.S. PATENT DOCUMENTS

| | | | |
|---|---|---|---|
| 4,234,854 | 11/1980 | Schellenberg et al. | 330/295 |
| 4,356,462 | 10/1982 | Bowman | 333/128 |
| 4,371,845 | 2/1983 | Pitzalis, Jr. | 330/286 |
| 4,562,409 | 12/1985 | Saito et al. | 330/295 |
| 4,641,106 | 2/1987 | Belohoubek et al. | 330/286 |
| 4,724,400 | 2/1988 | Luettgenau | 330/295 |
| 5,032,798 | 7/1991 | Myer | 330/295 |
| 5,218,322 | 6/1993 | Allison et al. | 330/286 |
| 5,256,988 | 10/1993 | Izadian | 330/295 |
| 5,394,125 | 2/1995 | Bartley et al. | 330/286 |

OTHER PUBLICATIONS

Ikeda et al., "A Low Distortion and High Efficiency Parallel–Operation Power Amplifier Combined in Different Phases in Wide Range of Load Impedances," vol. 2, 1996 IEEE MTT–S Int'l Microwave Symp. Dig., San Francisco, Jun. 17, 1996, pp. 535–38.

Martinetti et al., "N–Way Microwave Power Splitter/Combiner," RCA Technical Notes, No. 1359, Oct. 1984, pp. 1–3.

*Primary Examiner*—Benny Lee
*Assistant Examiner*—Khanh Van Nguyen

[57] ABSTRACT

A multicarrier linear RF power amplifier incorporating an improved signal splitter and an improved signal combiner is disclosed. The amplifier comprises a plurality of wedge-shaped amplifier modules. When such modules are radially disposed and abutted against one another, the inwardly facing edges of the modules collectively define a central or axially-located opening. An improved signal splitter, signal combiner, or dual splitter/combiner is advantageously disposed in the axially-located opening. The signal splitter or signal combiner is a conductor arrangement comprising a plurality of equal length conductors radially disposed on a dielectric substrate. The conductor arrangement is advantageously disposed within a suitably-configured housing. The housing is disposed within the axially-located opening.

12 Claims, 6 Drawing Sheets

100

ARTICLE COMPRISING A COMBINER-SPLITTER

FIELD OF THE INVENTION

The present invention relates generally to telecommmunications. More particularly, the present invention relates to an a combiner-splitter for use in conjunction with a multi-carrier RF amplifier.

BACKGROUND OF THE INVENTION

FIG. 1 depicts a schematic diagram of a portion of a typical wireless communications system in the prior art. Such a system provides wireless telecommunications service to a number of wireless terminals (e.g. wireless terminals 101-1 through 103-1) that are situated within a geographic region.

The heart of a typical wireless telecommunications system is Wireless Switching Center ("WSC") 120, which may also be known as a Mobile Switching Center ("MSC") or a Mobile Telephone Switching Office ("MTSO"). Typically, WSC 120 is commented to a plurality of base stations (e.g., base stations 103-1 through 103-5) that are dispersed throughout the geographic area serviced by the system. Additionally, WSC 120 is connected to local-and toll-offices (e.g., local-office 130, local-office 138 and toll-office 140). WSC 120 is responsible for, among other things, establishing and maintaining calls between wireless terminals and between a wireless terminal and a wireline terminal, which is connected to the system via the local and/or long-distance networks.

The geographic area serviced by a wireless telecommunications system is partitioned into a number of spatially-distinct areas called "cells." As depicted in FIG. 1, each cell is schematically represented by a hexagon; in practice, however, each cell usually has an irregular shape that depends on terrain topography. Typically, each cell contains a base station, which comprises radios and antennae that the base station uses to communicate with the wireless terminals in that cell and also comprises the transmission equipment that the base station uses to communicate with WSC 120.

For example, when wireless terminal 101-1 desires to communicate with wireless terminal 101-2, wireless terminal 101-1 transmits the desired information to base station 103-1, which relays the information to WSC 120. Upon receiving the information, and with the knowledge that it is intended for wireless terminal 101-2, WSC 120 then returns the information back to base station 103-1, which relays the information, via radio, to wireless terminal 101-2.

The manner in which the information received from WSC 120 is processed within base station 103-1 is depicted in FIG. 2. Such information is transmitted from WSC 120 to base station 103-1 as multiplexed signal 202. Such a signal comprises a multiplicity of constituent signals, which, in the context of present discussion, are RF carrier signals. Each one of such constituent RF carrier signals differs from all other of such signals in accordance with a particular multiplexing scheme used (e.g., time-division-multiplexing, frequency-division-multiplexing, code-division-multiplexing, etc.).

When received by base station 103-1, signal 202 is de-multiplexed into its constituent RF carrier signals $\mathbf{202}_{i,i=1,N}$ in demultiplexer 204. Each one of the N constituent RF carrier signals is routed to a corresponding one of N radios $\mathbf{206}_{i,i=1,N}$. Each radio 206 is operable to modulate a message signal onto the one constituent signal $\mathbf{202}_i$ that it receives in accordance with a particular modulation scheme (e.g., time-division-multiple-access, code-division-multiple-access, etc.). A modulated RF carrier signal $\mathbf{208}_i$ generated by each radio is delivered to summing device 210 wherein such modulated carrier signals are summed to generate multicarrier RF signal 212.

As the modulated RF carrier signals $\mathbf{208}_i$ generated by the radios are very low power signals, multicarrier RF signal 212 must be routed to amplifier 214, typically a feedforward multicarrier linear RF power amplifier ("FMLRF power amp"), to boost signal strength for transmission from the base station to various wireless terminals, such as 101-2. A FMLRF power amp can usually amplify all RF carrier signals in use within a given cell. The design and operation of such amplifiers are familiar to those skilled in the art. See, for example. U.S. Pat. No. 5,304,945, incorporated by reference herein.

Within FMLRF power amp 214, multicarrier RF signal 212 is divided by splitter 216 into J equal power signals $\mathbf{212}_i$ and delivered to J identical amplifier modules $\mathbf{218}_i$. Each one of the signals $\mathbf{212}_i$ is amplified to a set output power in the amplifier modules. J amplified signals $\mathbf{220}_i$ from the amplifier modules are combined to form modulated multicarrier RF signal 224 in combiner 222. The signal 224 is routed to antenna 226 for transmission, such as to wireless terminal 101-2.

Ever-increasing wireless traffic results in a need to increase the calling capacity of such wireless systems. One way to increase calling capacity is to increase the number of cells within a given geographic area. Such an increase results in smaller cells, and, of course, more base stations. Increasing the number of cells results in a decrease in signal transmission power requirements (due to a smaller coverage area), thus enabling use of smaller, lower power FMLRF power amps.

Past splitter and combiner designs for conventional high power FMLRF power amps have utilized cavities of a specific size and geometry well-matched to such larger FMLRF power amps. With the decreasing size requirements of such power amps, a new more compact design for a power splitter and power combiner are needed.

SUMMARY OF THE INVENTION

A multicarrier linear RF power amplifier incorporating an improved signal splitter and an improved signal combiner is disclosed. The amplifier comprises a plurality of wedge-shaped amplifier modules. When such modules are radially disposed and abutted against one another, the inwardly facing edges of the modules collectively define a central or axially-located opening. An improved signal splitter, signal combiner, or dual splitter/combiner in accordance with an illustrative embodiment of the present invention is advantageously disposed in the axially-located opening.

In some embodiments, a signal splitter or signal combiner is a conductor arrangement comprising a plurality of equal length conductors radially disposed on a suitable dielectric surface. The conductor arrangement is advantageously disposed within a suitably-configured housing. The housing is disposed within the axially-located opening.

Each conductor within the arrangement has a length $\lambda/4$, where $\lambda$ is the center frequency of the multicarrier signal. The impedance of each conductor is given by: $Z=Z_o n^{1/2}$, where $Z_o$ is the desired impedance of the lines external to the splitter or the combiner, typically 50 ohms, and n is the number of conductors in the plurality.

In some embodiments, each conductor is advantageously "suspended" within the housing, thereby minimizing signal loss. In some embodiments, that is achieved by locating the conductors in cylindrical cavities formed within the interior of the housing. Each conductor is "suspended" within the cavity on the dielectric surface.

DETAILED DESCRIPTION OF THE INVENTION

Figure 3:
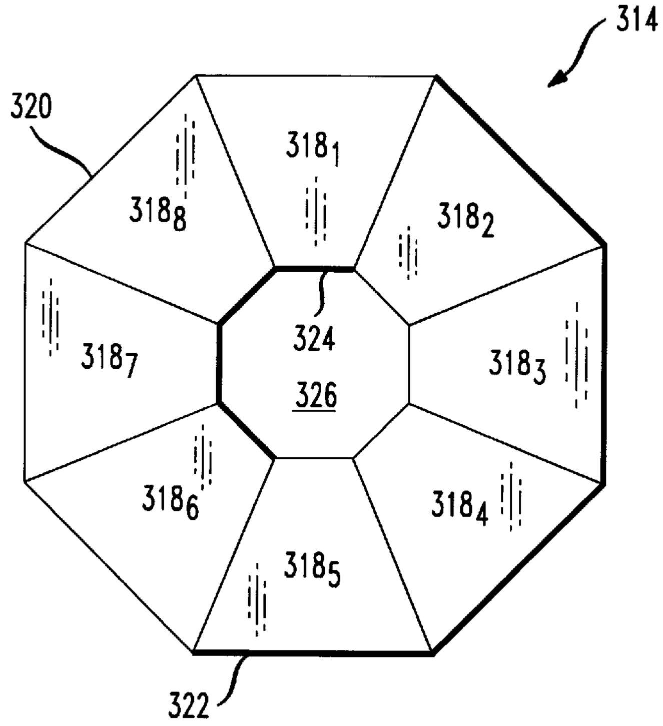
FIG. 3 depicts a top view of a portion of a multicarrier linear amplifier in accordance with an illustrative embodiment of the present invention.

FIG. 3 is a top view of a portion of illustrative multicarrier linear amplifier 314 showing eight wedged-shaped, equal-sized, radially arranged amplifier modules $\mathbf{318}_1$–$\mathbf{318}_8$. The amplifier modules $\mathbf{318}_i$ are suitably dimensioned so that when disposed in abutting relation as shown in FIG. 3, octagonally-shaped perimeter 322 is defined, collectively, by outwardly-facing edge 320 of each module. Additionally, when arranged as shown in FIG. 3, octagonally-shaped region 326 is defined, collectively, by inwardly-facing edge 324 of each module.

Figure 4:
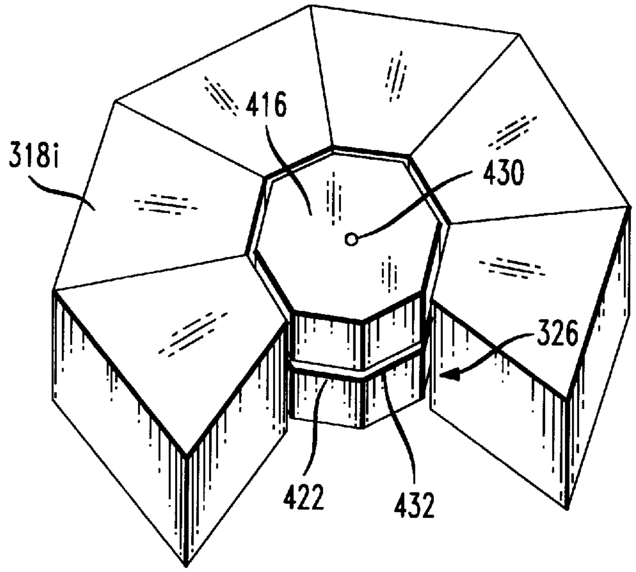
FIG. 4 depicts a perspective view of the portion of the multicarrier linear amplifier of FIG. 3 with several amplification modules removed to show a splitter housing and a combiner housing.

FIG. 4, which depicts a perspective view of the FIG. 3 (with several amplifier modules removed for clarity of illustration), shows splitter housing 416 and combiner housing 422 advantageously axially aligned within region 326 formed by the amplifier modules $\mathbf{318}_i$. Positioning a signal splitter, signal combiner, or both, in such manner is known in the art. When such devices are so aligned, equal length signal paths are readily obtained for each of i unamplified "split" signals traveling from the splitter to each of n amplifier modules, and for each of n amplified signals traveling from each amplifier module to the combiner. Such equal length signal paths are required to maintain phase relations between each of the n unamplified signals generated by the splitter and each of the n amplified signals delivered to the combiner.

Figure 1:
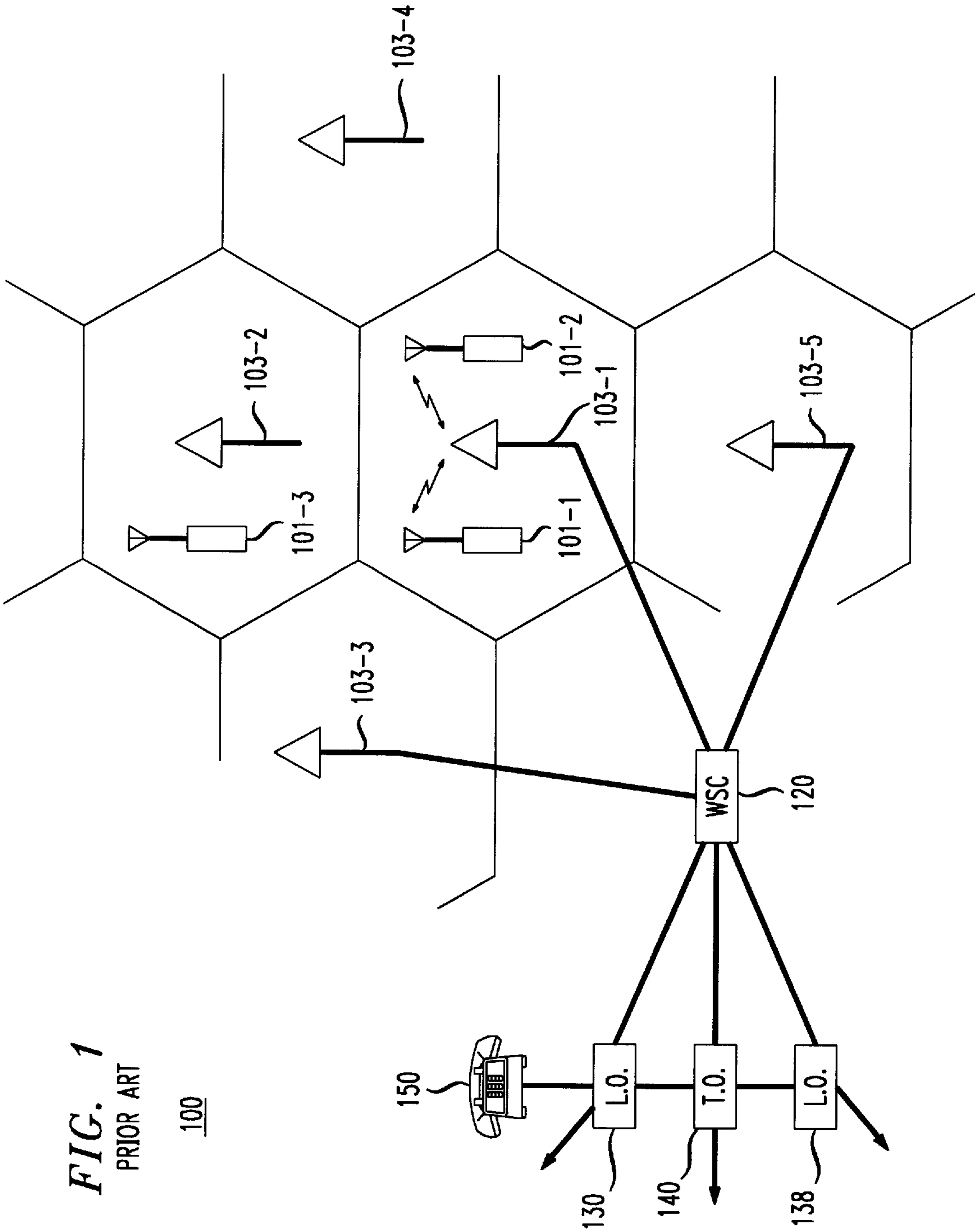
FIG. 1 PRIOR ART
FIG. 1 depicts a schematic diagram of a prior art wireless telecommunication system.
Figure 2:
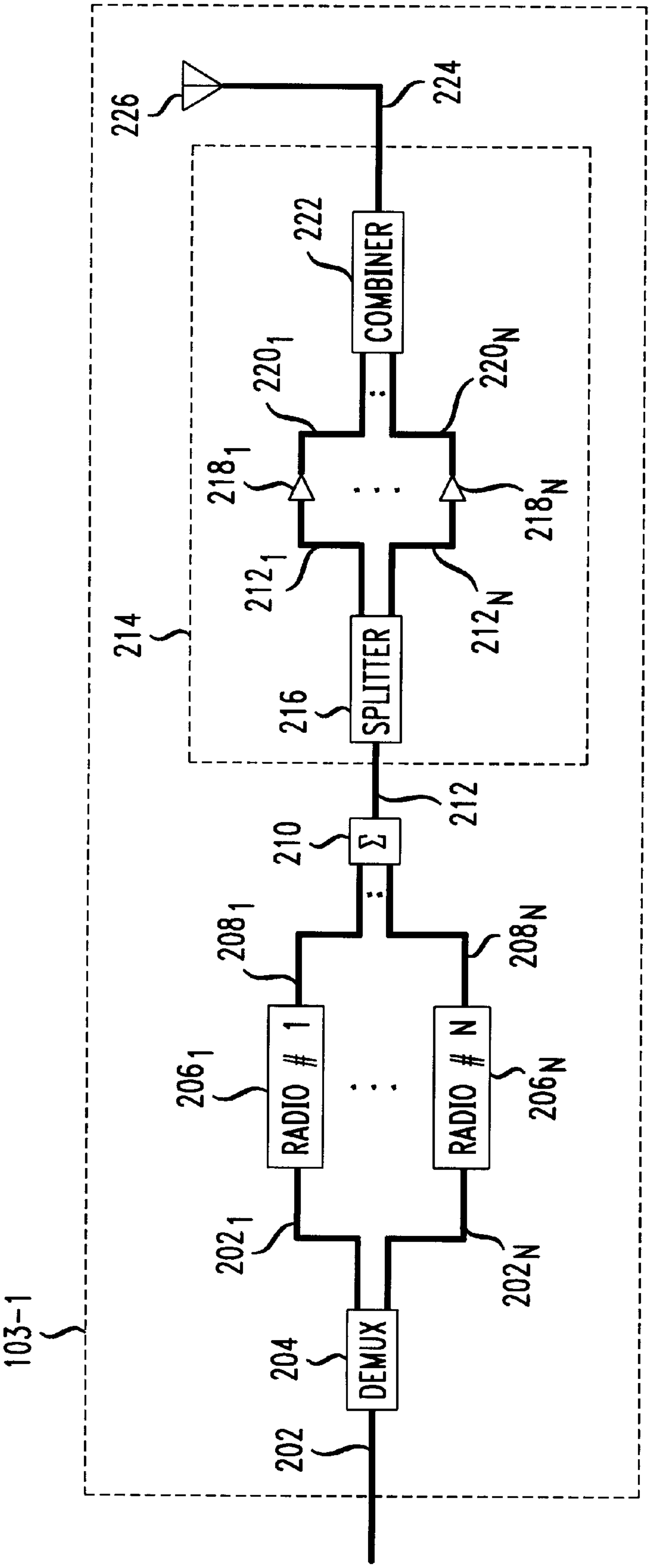
FIG. 2 PRIOR ART
FIG. 2 depicts a simplified diagram of the manner in which a multiplexed signal received from a wireless switching center is processed in a prior art base station.

Splitter housing 416 includes axially-aligned port 430 for receiving a low power multicarrier RF signal from a summer (See FIG. 2). Combiner housing 422 likewise includes axially-aligned port 432 to which an amplified multicarrier RF signal is delivered. Splitter housing 416 further includes eight output ports (not shown) for delivering each one of the eight split signals to one of the eight amplifier modules $\mathbf{318}_i$. Likewise, combiner housing 422 includes eight input ports (not shown) for receiving each one of eight amplified signals from the eight amplifier modules. Each amplifier module $\mathbf{318}_i$ has an input port and an output port (not shown) for receiving and delivering respective unamplified and amplified signals. The eight output ports on splitter housing 416 and the eight input ports on amplifier modules $\mathbf{318}_i$ are disposed in a uniform manner so that the path length for each of the eight split signals are identical. The eight input ports on combiner housing 422 and the eight output ports on the amplifier modules are arranged to similar effect.

Figure 5:
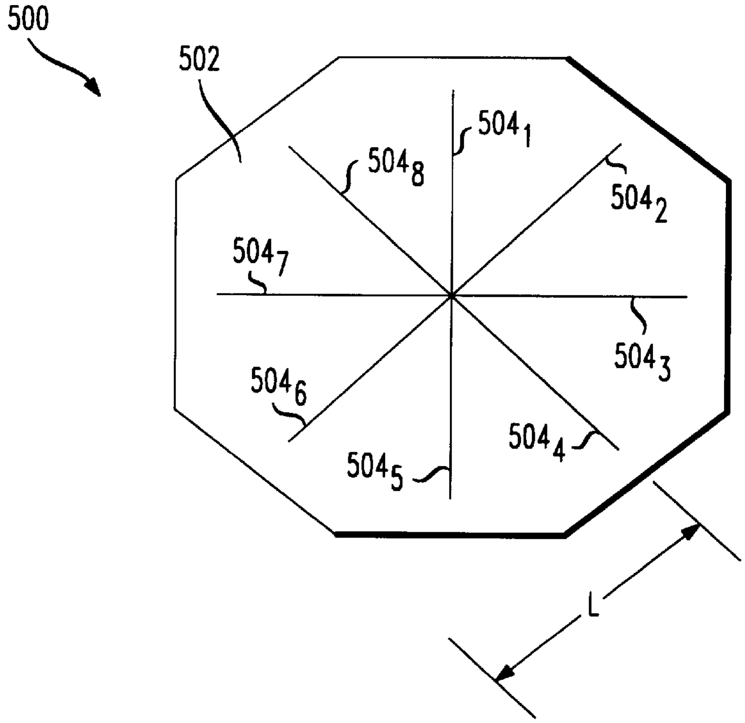
FIG. 5 depicts a conductor arrangement in accordance with an illustrative embodiment of the present invention.

FIG. 5 depicts a conductor arrangement 500 in accordance with an illustrative embodiment of the present invention suitable for functioning as a splitter or combiner. Such a conductor arrangement is located within splitter and combiner housings 416, 422. Eight conductors $\mathbf{504}_1$–$\mathbf{504}_8$ having the same length are equiangularly disposed in radial fashion on insulating surface 502. In some embodiments, the insulating surface 502 is a dielectric material. The length,l, of each conductors $\mathbf{504}_i$ is $\lambda/4$, where $\lambda$ is the center frequency of multicarrier signal being processed.

The impedance of the lines external to the splitter or combiner is typically 50 ohms. To achieve impedance match, the impedance of each conductor $\mathbf{504}_i$ must be:

$$Z=Z_o n^{1/2}, \quad [1]$$

where: $Z_o$ is 50 ohms and n is the number of conductors. For example, if there are eight conductors, then the impedance of each conductor $\mathbf{504}_i$ is $50(8)^{1/2}=141$ ohms. It is known to those skilled in the art how to design a conductor to have a specific impedance (e.g., 141 ohms) by appropriately selecting line width, dielectric, and the like.

Figure 6A:
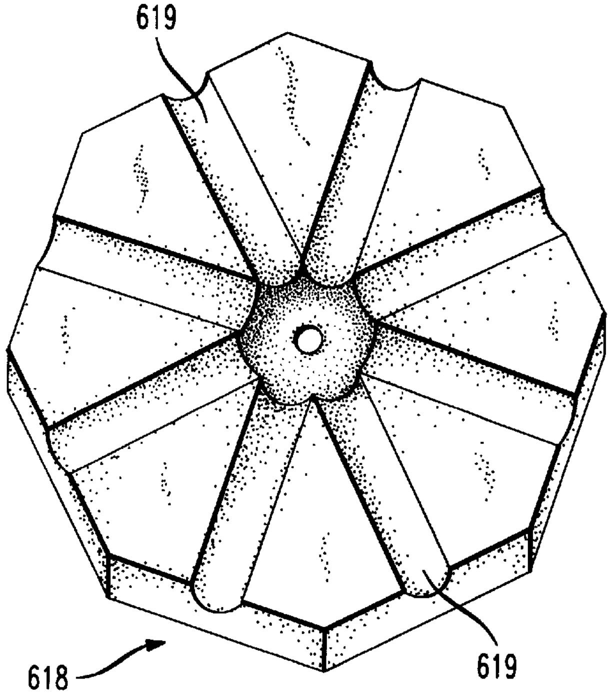
FIG. 6 depicts grooves formed in plates of a combiner or splitter housing in accordance with an illustrative embodiment of the present invention.
Figure 6B:
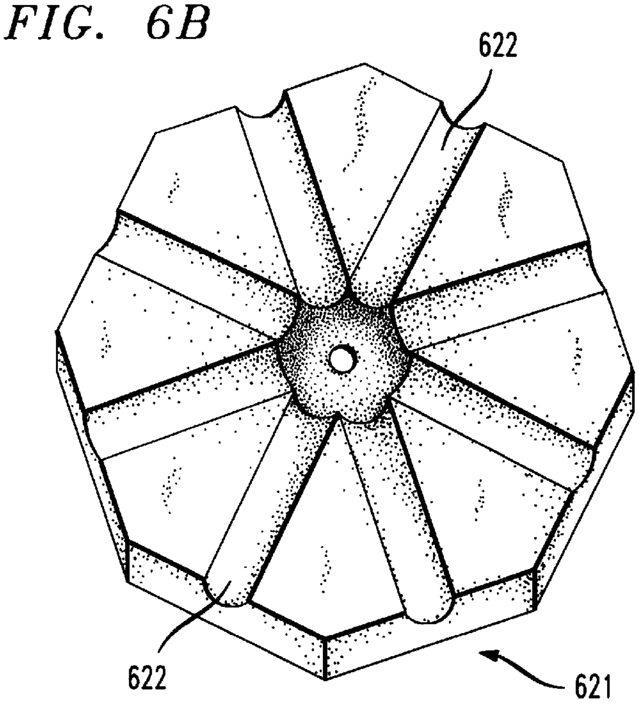
Figure 7:
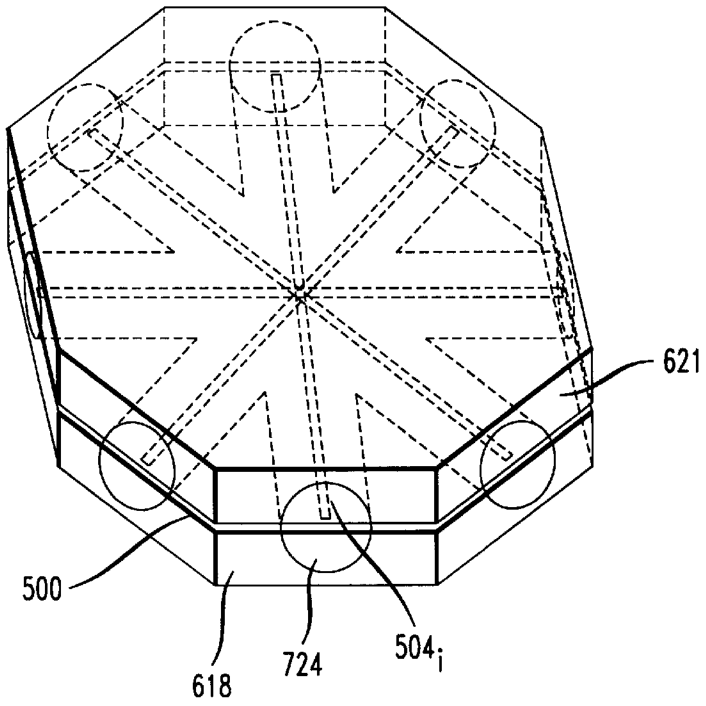
FIG. 7 depicts a perspective view of a combiner or splitter housing incorporating cylindrical cavities formed by abutting the grooved plates of FIG. 6.

To minimize signal loss, each conductor $\mathbf{504}_i$ is advantageously "suspended" within housings 416, 422. In some embodiments that may be accomplished by forming semicircularly-shaped grooves 619 and 622 within respective upper and lower portions 618 (FIG. 6*a*) and 621 (FIG. 6*b*) of illustrative splitter or combiner housing 620. FIG. 7 depicts upper and lower portions 618, 621 of housing 620 joined. Conductor arrangement 500 is disposed between the joined portions. Conductors $\mathbf{504}_i$ are "suspended" on a dielectric surface, such as is used for forming printed circuit boards, within cylindrical cavities 724. Note that for such a suspended conductor, a dielectric constant is estimated that accounts for the fact that there is dielectric material surrounded by air.

In the illustrative embodiment depicted in FIGS. 3–5, the multicarrier linear RF amplifier 314 was assumed to be comprised of eight amplifier modules. It should be appreciated that in other embodiments for other applications such an amplifier may be comprised of other numbers of amplifier modules. If a different number of amplifier modules is used, splitter and combiner housings 416, 422 (FIG. 4) will typically have a different shape consistent with such different number of modules. And, of course, the number of conductors will change directly with the number of amplifier modules. For example, if six amplifier modules are used, the region 326 (FIG. 3) will typically have a hexagonally-shaped perimeter such that the splitter and combiner housings are advantageously hexagonally-shaped. Moreover, if six amplifier modules are used, then six conductors should be used.

Figure 8:
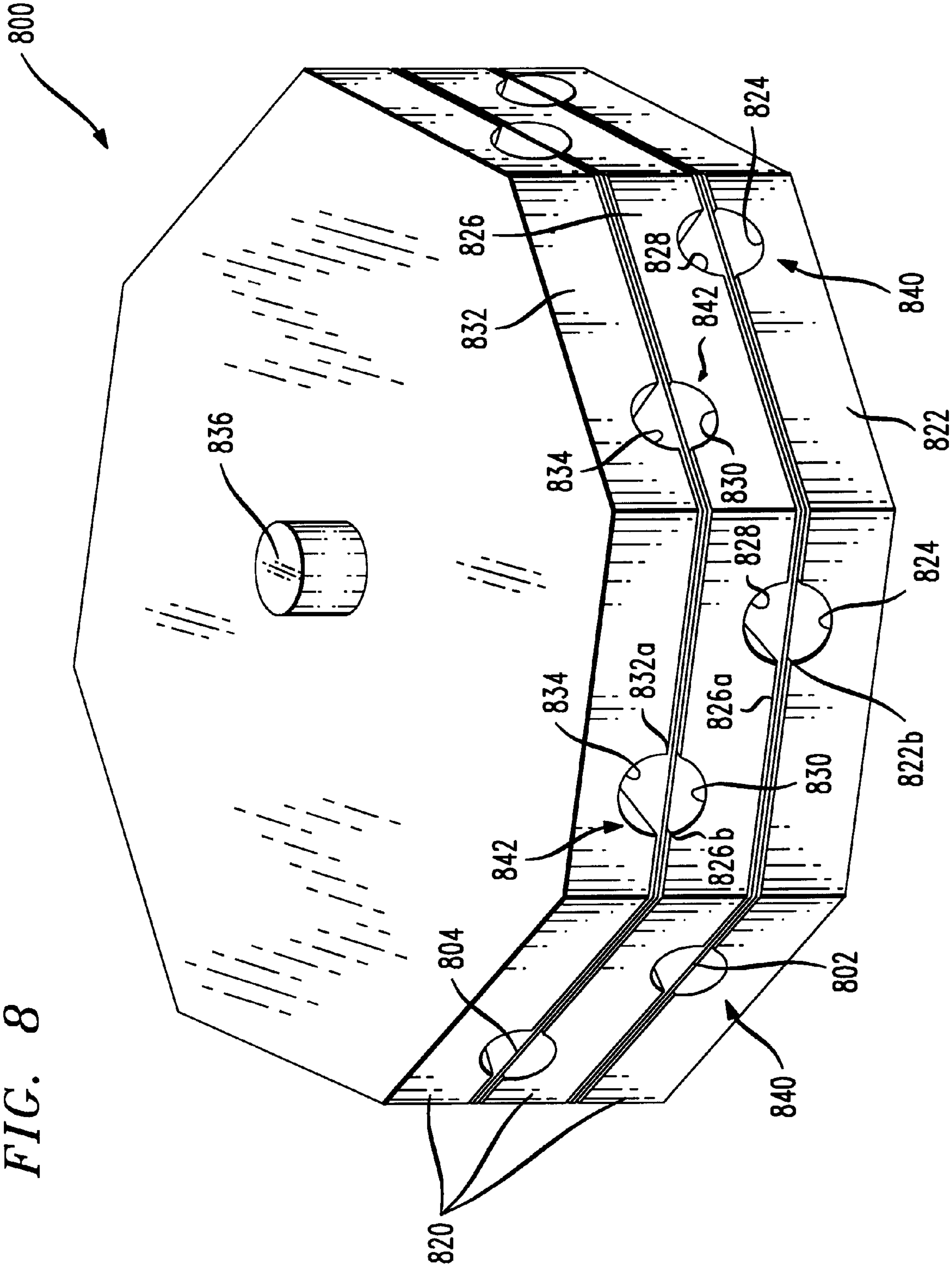
FIG. 8 depicts a dual splitter/combiner in accordance with an illustrative embodiment of the present invention.

In the illustrative embodiments described above, the splitter and the combiner were disposed in separate housings. In other embodiments, the splitter and combiner are advantageously disposed in a single housing. Such a dual splitter/combiner requires two separator conductor arrangements, one to function as a splitter, the other as the combiner. FIG. 8 depicts a perspective view of a dual splitter/combiner 800 including three-piece housing 820 and first and second conductor arrangements 802. 804 in accordance with the present invention. One of the conductor arrangements functions as a splitter, and the other conductor arrangement functions as a combiner. It should be understood that such functionality is determined based on the way a conductor arrangement is integrated with the rest of the amplifier. That is, if a signal is delivered to the center of a conductor arrangement, it will functions as a splitter; if signals are delivered to the end of each conductor of the arrangement, the arrangement will function as a combiner. Each of the conductor arrangements includes a number, n, of conductors (not shown). As previously described, the particular number, n, of conductors in the conductor arrangements is dictated by the number of amplifier modules.

Three piece housing 820 comprises lower plate 822, middle plate 826 and upper plate 832. Upper surface **822*b* of lower plate 822 advantageously includes n semicircularly-shaped grooves 824, one for each conductor $\mathbf{802}_i$ of first conductor arrangement 802. Lower surface 826*a* of middle plate 826 advantageously includes n semicircularly-shaped grooves 828. Grooves 824 in lower plate 822 and grooves 828 on lower surface 826*a* of middle plate 826 are complimentarily located relative to one another so that when the lower and middle plates are placed in abutting relation, grooves 824 and 828 align forming a first group of n cylindrical cavities 840 for receiving a like number n of conductors from first conductor arrangement 802**.

Upper surface **826*b* of middle plate 826 includes n semicircularly-shaped grooves 830. And, lower surface 832*a* of upper plate 832 includes n semicircularly-shaped grooves 834. When upper plate 832 and middle plate 826 are placed in abutting relation, grooves 830 and 834 align forming a second group of n cylindrical cavities 842 for receiving the n conductors from second conductor arrangement 804. The middle plate advantageously provides shielding between first conductor arrangement 802 and second conductor arrangement 804**.

In the dual splitter/combiner 800 depicted in FIG. 8, grooves 824 in the lower plate and grooves 828 in the lower surface of the middle plate are advantageously offset from grooves 830 in the upper surface of the middle plate and grooves 832 of the upper plate. Such an offset results in thinner plates and results in a natural offset between a first set of ports/interfaces (required for electrical connection between the conductor arrangement functioning as a splitter and the amplifier modules) and a second set of ports/interfaces (required for electrical connection between the amplifier modules and the conductor arrangement functioning as a combiner).

The unamplified multicarrier RF signal is delivered, via axially-aligned port 836 through upper plate 832 to one of the conductor arrangements. Due to the equal signal path lengths between the center of the conductor arrangement and the input of each amplifier module, the multicarrier RF signal is split into n equal power signals traveling along the n conductors. The amplified signals returning from the amplifier modules are delivered to the conductors in the other conductor arrangement, and are combined into a single amplified multicarrier RF signal at the center of that conductor arrangement. The amplified multicarrier RF signal leaves the combiner through an axially-aligned port (not shown) extending through bottom plate 822. It should be understood that the configuration of the splitter/combiner can be reversed, wherein the unamplified input is received at the port in the bottom plate and the amplified output is delivered to port 836 through the top plate.

Although specific embodiments of this invention have been shown and described herein, it is to be understood that these embodiments are merely illustrative of the many possible specific arrangements that can be devised in application of the principles of the invention. Numerous and varied other arrangements can be devised in accordance with these principles by those of ordinary skill in the art without departing from the scope and spirit of the invention. It is therefore intended that such other arrangements be included within the scope of the following claims and their equivalents.

What is claimed is:

1. An article for amplifying a first multicarrier RF signal, comprising:

a first plurality of radially-arranged conductors that are disposed on a first dielectric surface and suspended within a first housing, wherein said first plurality of radially-arranged conductors are operable to divide the first multicarrier RF signal into a plurality of equal-power multicarrier RF signals, wherein one multicarrier RF signal is carried along each radially-arranged conductor;

a plurality of amplifier modules, wherein each amplifier module is electrically connected to one of the radially-arranged conductors of the first plurality and is operable to amplify the one multicarrier RF signal carried along the one radially-arranged conductor electrically connected thereto; and a second plurality of radially-arranged conductors that are disposed on a second dielectric surface and suspended within said first housing, wherein each radially-arranged conductor of the second plurality is electrically connected to one of the amplifier modules, and further wherein each radially-arranged conductor of the second plurality is operable to receive the one amplified multicarrier RF signal from the amplifier module electrically connected thereto, and, further, the second plurality of radially-arranged conductors is operable, collectively, to combine the amplified multicarrier RF signals into a second multicarrier RF signal.

2. The article of claim 1 wherein said housing comprises a lower plate, a middle plate and an upper plate, and the middle plate shields the first plurality of radially-arranged conductors from the second plurality of radially-arranged conductors.

3. The article of claim 1 wherein the first multicarrier RF signal is delivered to a central axis of the first plurality of radially-arranged conductors, wherein, at the central axis, all the radially-arranged conductors of the first plurality are in physical contact with one another.

4. The article of claim 3 wherein the amplified multicarrier RF signals are combined into the second multicarrier RF signal at a central axis of the second plurality of radially-arranged conductors wherein all the such conductors are in physical contact with one another.

5. The article of claim 3 wherein signal path length from the central axis of the first plurality of radially-arranged conductors to the central axis of the second plurality of radially-arranged conductors along any one of the radially-arranged conductors is equal to the signal path length along any other of the radially-arranged conductors.

6. The article of claim 1 wherein the length of each conductor is $\lambda/4$, where $\lambda$ is the center frequency of the first multicarrier RF signal.

7. The article of claim 1 wherein each radially-arranged conductor of the first plurality is disposed within one cylindrically-shaped cavity of a first group of such cavities within the first housing.

8. The article of claim 1 wherein each radially-arranged conductor of the second plurality is disposed within one cylindrically-shaped cavity of a second group of such cavities within the first housing.

9. A base station for a wireless telecommunications system comprising:

a demultiplexer for demultiplexing a multiplexed RF signal into a first plurality of RF signals;

a plurality of radios, each of which radios is operable to receive one of the RF signals of the first plurality and modulate a message signal thereon;

a summing device for combining the modulated RF signals from the plurality of radios into a first multicarrier RF signal;

a multicarrier linear RF amplifier for amplifying the multicarrier RF signal, the amplifier comprising:

a first plurality of radially-arranged conductors that are disposed on a first dielectric surface and suspended within a first housing, wherein said first plurality of radially-arranged conductors are operable to divide the first multicarrier RF signal into a plurality of equal-power multicarrier RF signals, wherein one multicarrier RF signal is carried along each radially-arranged conductor;

a plurality of amplifier modules, wherein each amplifier module is electrically connected to one of the radially-arranged conductors of the first plurality and is operable to amplify the one multicarrier RF signal carried along the one radially-arranged conductor electrically connected thereto; and a second plurality of radially-arranged conductors that are disposed on a second dielectric surface and suspended within said first housing, wherein each radially-arranged conductor of the second plurality is electrically connected to one of the amplifier modules, and further wherein each radially-arranged conductor of the second plurality is operable to receive the one amplified multicarrier RF signal from the amplifier module electrically connected thereto, and, further, the second plurality of radially-arranged conductors is operable, collectively, to combine the amplified multicarrier RF signals into a second multicarrier RF signal; and an antenna for transmitting the second multicarrier RF signal.

10. An article for splitting a signal into a plurality of equi-power signals, comprising:

a first plurality of equal length, radially-arranged conductors, wherein said first plurality of conductors physically contact one another at a first central axis and further wherein said first plurality of conductors are disposed on a first dielectric substrate and suspended within a first plurality of cylindrical cavities, one conductor per cylindrical cavity;

a first input port disposed at the first central axis and operable to deliver a signal to the first plurality of radially-arranged conductors; and a plurality of output ports, wherein each output port is operable to receive one equi-power signal carried on one of the radially-arranged conductors of the first plurality.

11. The article of claim 10, and further comprising:

a second plurality of equal length, radially-arranged conductors, wherein said second plurality of conductors physically contact one another at a second central axis and further wherein said second plurality of conductors are disposed on a second dielectric substrate and suspended within a second plurality of cylindrical cavities, one conductor per cylindrical cavity;

a plurality of input ports, wherein each input port of the plurality is operable to receive one signal of a plurality of such signals and deliver it to one of the radially-arranged conductors of the second plurality; and an output port disposed at the second central axis and operable to receive a combined signal formed at the second central axis from the plurality of signals.

12. An article for combining a plurality of signals into a combined signal, comprising:

a plurality of equal length, radially-arranged conductors, wherein the conductors physically contact one another at a central axis and further wherein said plurality of conductors are disposed on a dielectric substrate and suspended within a plurality of cylindrical cavities, one conductor per cylindrical cavity;

a plurality of input ports, wherein each input port is operable to receive one signal of the plurality of such signals and deliver it to one of the radially-arranged conductors; and an output port disposed at the central axis and operable to receive the combined signal formed at the central axis from the plurality of signals.

* * * * *